US012670967B2

(12) United States Patent (10) Patent No.: US 12,670,967 B2
Suzuki et al. (45) Date of Patent: Jun. 30, 2026

(54) APPARATUSES AND METHODS FOR TESTING MEMORY DEVICES

(71) Applicant: MICRON TECHNOLOGY, INC., Boise, ID (US)

(72) Inventors: Takamasa Suzuki, Tokyo (JP); Yasushi Matsubara, Isehara (JP); Harutaka Makabe, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 96 days.

(21) Appl. No.: 18/612,284

(22) Filed: Mar. 21, 2024

(65) Prior Publication Data

US 2024/0331794 A1 Oct. 3, 2024

Related U.S. Application Data

(60) Provisional application No. 63/455,673, filed on Mar. 30, 2023.

(51) Int. Cl.
*G11C 29/18* (2006.01)
*G11C 29/24* (2006.01)
*G11C 29/44* (2006.01)

(52) U.S. Cl.
CPC .............. *G11C 29/44* (2013.01); *G11C 29/18* (2013.01); *G11C 29/24* (2013.01); *G11C 2029/1806* (2013.01)

(58) Field of Classification Search
CPC ......... G11C 29/44; G11C 29/18; G11C 29/24; G11C 2029/1806; G11C 29/81; G11C 29/4401; G11C 29/76
See application file for complete search history.

(56) References Cited

U.S. PATENT DOCUMENTS

| | | | | |
|---|---|---|---|---|
| 6,408,401 B1* | 6/2002 | Bhavsar | ............... | G11C 29/006 |
| | | | | 714/6.32 |
| 7,237,154 B1* | 6/2007 | Zorian | ............. | G11C 29/56008 |
| | | | | 714/721 |
| 2010/0067312 A1* | 3/2010 | Lee | ....................... | G11C 7/1063 |
| | | | | 365/201 |
| 2022/0199188 A1* | 6/2022 | Varadarajan | ........... | G11C 29/40 |

* cited by examiner

*Primary Examiner* — Mohammed A Bashar
(74) *Attorney, Agent, or Firm* — Dorsey & Whitney LLP

(57) ABSTRACT

Self-test circuits of memory devices disclosed herein may include circuitry that adjusts the correspondence between logical and physical addresses to match pre-repair mapping of memory locations. That is, if a memory device has been repaired by remapping logical addresses to new physical addresses, the circuitry of the test circuit restores the pre-repair mapping of the memory device in some examples. In some examples, an unused global column redundancy data path may be repurposed to provide repair information to the self-test circuit to implement the pre-repair mapping.

20 Claims, 9 Drawing Sheets

APPARATUSES AND METHODS FOR TESTING MEMORY DEVICES

CROSS REFERENCE TO RELATED APPLICATION(S)

This application claims the benefit under 35 U.S.C. § 119 of the earlier filing date of U.S. Provisional Application Ser. No. 63/455,673 filed Mar. 30, 2023, the entire contents of which are hereby incorporated by reference in their entirety for any purpose.

BACKGROUND

This disclosure relates generally to testing memory devices, including volatile memory, such as dynamic random access memory (DRAM). DRAM may be included in a high bandwidth memory (HBM). HBM may include a die (e.g., chip) stack with one or more core die and one or more interface (IF) die. Each core die may include one or more memory arrays made up of one or more memory cells. The IF die and/or one or more core die may include self-test circuits for detecting defects in the memory array. The die may be tested using the self-test circuits multiple times during different stages of fabrication (e.g., wafer stage, package stage) or multiple times during a same stage.

DETAILED DESCRIPTION

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Conductive structures may be used in a variety of semiconductor devices, for example, controllers and memories. Some conductive structures may be used for coupling two or more components. For example, an operational amplifier may be coupled to a power source by a conductive structure (e.g., wire). In order to couple components, the conductive structures may extend a distance across the device in some applications. Typically, devices include a significant number of conductive structures extending various distances across the device. The conductive structures may be placed close together in the device to save space. However, as the space between the conductive structures decreases, the risk of the conductive structures inadvertently touching one another and causing a short increases. Long lengths of the conductive structures may also increase the risk of short circuits.

Figure 1:
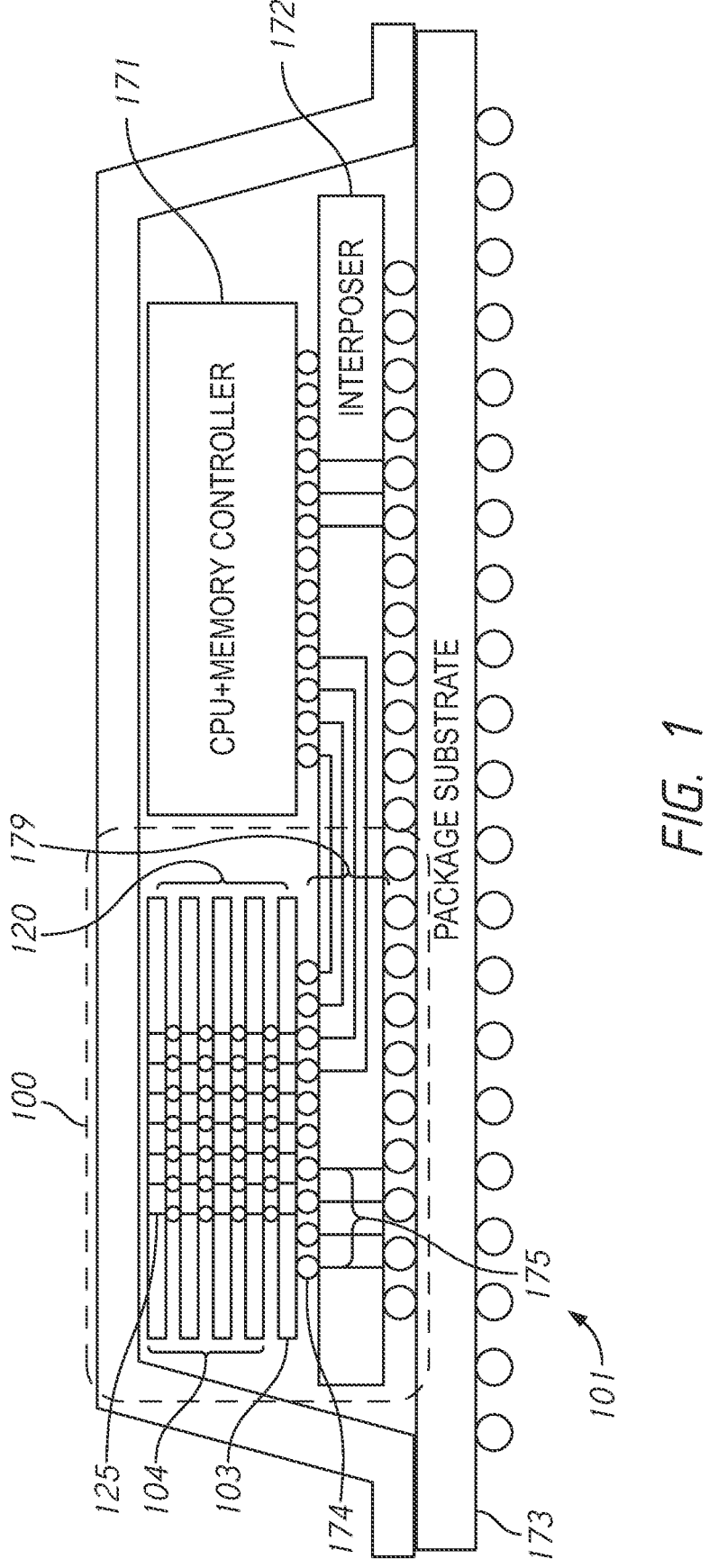
FIG. 1 is a schematic diagram of a semiconductor system including a semiconductor device that includes an interface die and a plurality of core dies, in accordance with embodiments of the present disclosure.

FIG. 1 is a schematic diagram of a semiconductor system including a semiconductor device that includes an interface (IF) die and a plurality of core dies, in accordance with embodiments of the present disclosure. For example, the semiconductor system 101 may include a semiconductor device 100, which may be a three-dimensional (3D) memory device, and a central processing unit (CPU) and memory controller 171, which may be a controller die, on an interposer 172 on a package substrate 173. The interposer 172 may include one or more power lines 175 which supply power supply voltage from the package substrate 173. The interposer 172 includes a plurality of channels 179 that may interconnect the CPU and memory controller 171 and the semiconductor device 100. While a CPU is shown in FIG. 1, in other embodiments, a graphical processing unit (GPU) may be included in addition to or instead of the CPU.

The semiconductor device 100 may be a high bandwidth memory (HBM) in some embodiments. The semiconductor device 100 may include multiple dies (e.g., die) 120 including an interface (IF) die 103 and core dies 104 stacked with each other. In this example, each core die 104 may be a memory die. Each of the core dies 104 may include memory cells, which may be arranged in one or more memory arrays. The core dies 104 may further include circuitry for accessing the memory cells. In some examples, the memory cells may be DRAM memory cells. The IF die 103 may include circuitry for accessing the memory cells on the core dies 104 for memory operations. For example, the IF die 103 may include a command/address input circuit for receiving commands and addresses from the memory controller 171. In some examples, the IF die 103 may include an internal clock generator for providing clock signals to the core dies 104 and/or other components of the IF die 103. In some examples, the IF die 103 may include an internal voltage generator that may receive power from power lines 175 and provide various voltages (e.g., VSS, VDD) to the core dies 104 and/or other components of the IF die 103.

The semiconductor device 100 may include conductive vias TSVs 125 (e.g., through substrate electrodes) which couple the IF die 103 and core dies 104 by penetrating the IF die 103 and core dies 104. The IF die 103 may be coupled to the interposer 172 via interconnects, such as bumps 174.

For example, the bumps 174 may be microbumps having bump pitches of less than about or less than one hundred micro meters and exposed on an outside of the IF die 103. A portion of the bumps 174 may be coupled to the one or more power lines 175. Another portion of the bumps 174 may be coupled to the plurality of channels 179.

Memory die, such as the IF die 103 and/or core die 104, may be tested for defects multiple times during fabrication and after fabrication. For example, a die may be tested one or more times during the wafer stage and one or more times during the package stage. Self-test circuits included on the die may be used for one or more of such tests. In some embodiments, the IF die 103 and/or one or more of the core die 104 may include one or more probe pads. The probe pads may provide access to one or more self-test circuits included on the die to a test probe (not shown). In some embodiments, a probe pad may be implemented by one or more of the TSVs 125 of a die. In some embodiments, a probe pad may be an external terminal of a die separate from TSVs 125. In some embodiments, the IF die 103 and/or one or more of the core die 104 may include a probe pad that is accessible to a test probe when the die is at a wafer stage and/or package stage.

In some cases, when a defect is found on the die, it can be repaired. Memory arrays may be made with redundant (e.g., extra) rows and columns that can be used to "replace" a defective row or column, respectively. For example, defective column may be repaired by remapping the logical address originally assigned to a physical address of the defective column to a physical address of a redundant column. In another example, an entire column plane may be remapped to a redundant column plane.

However, in some cases, when a memory die is tested (e.g., retest) again after the repair and a new defect is found, the test circuit may not be able to determine the correct physical address of the defect. This may cause the test circuit to indicate the wrong row, column, and/or column plane that requires repair. Or, it may cause the test circuit to incorrectly indicate the defect is at a location that has already been repaired, and the defect can be ignored.

According to embodiments of the present disclosure, a self-test circuit (or simply test circuit) of a memory die may include circuitry (e.g., one or more circuits) that adjusts the correspondence between logical and physical addresses to match the pre-repair mapping. This may allow the test circuit to accurately indicate a physical location of an additional defect that developed between a test and a retest and/or the original defect that was repaired. In some embodiments, unused data paths associated with a redundant memory location (e.g., column plane) may be used to provide repair information to the circuitry that restores the pre-repair mapping for the test circuit.

While the examples provided herein relate to HBM, the principles of the present disclosure are not limit to this application. That is, the testing schemes as described herein may be provided in other memory types (e.g., DDR, LPDDR).

Figure 2:
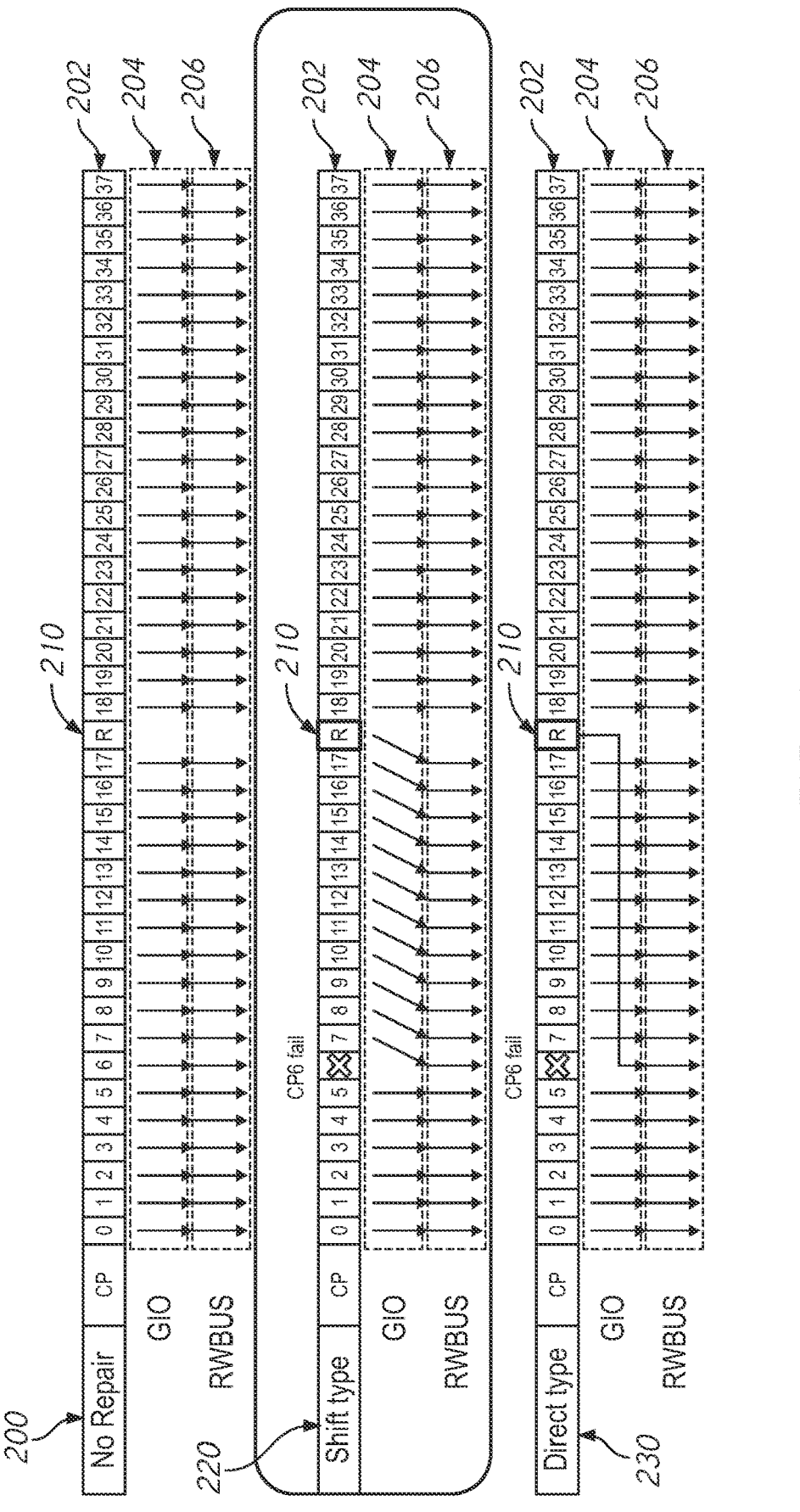
FIG. 2 illustrates different types of column plane repairs for a memory device according to embodiments of the present disclosure.

FIG. 2 illustrates different types of column plane repairs for a memory device according to embodiments of the present disclosure. The repair schemes shown in FIG. 2 may be used to repair memory arrays included in memory die, such as the IF die 103 and/or core die 104 shown in FIG. 1. When there is no repair 200, during a read operation, data from the column planes (CP) 202 is mapped to channels of the global input-output (GIO) bus 204 and corresponding channels of the read-write (RW) bus 206. Because all of the column planes 202 are operating properly, a redundant column plane (R) 210 is not used.

In the example shown in FIG. 2, a failure occurs in CP6. In a shift type 220 repair scheme, the redundant column plane 210 is mapped to the GIO 204 and RW bus 206 previously assigned to CP17, and the mapping of CP17 is shifted to the channels previously assigned to CP16, which is also shifted, and so on until CP7. Mapping of CP0-5 remain un-shifted. Instead of the redundant plane 210 being left unused, the defective CP6 "replaces" the redundant plane 210 as the unused column plane.

In a direct type 230 repair scheme, to repair defective CP6, the redundant column plane 210 is mapped to the GIO 204 and RW bus 206 previously assigned to CP6, and the mapping for all of the remaining CP remain the same. Similar to the shift type 220 repair scheme, instead of the redundant plane 210 being left unused, the defective CP6 "replaces" the redundant plane 210 as the unused column plane.

While read examples are shown in FIG. 2, it is understood a similar mapping and data flow would occur for write operations, but from the RW bus 206 to the GIO 204 to the column planes 202.

Figure 3:
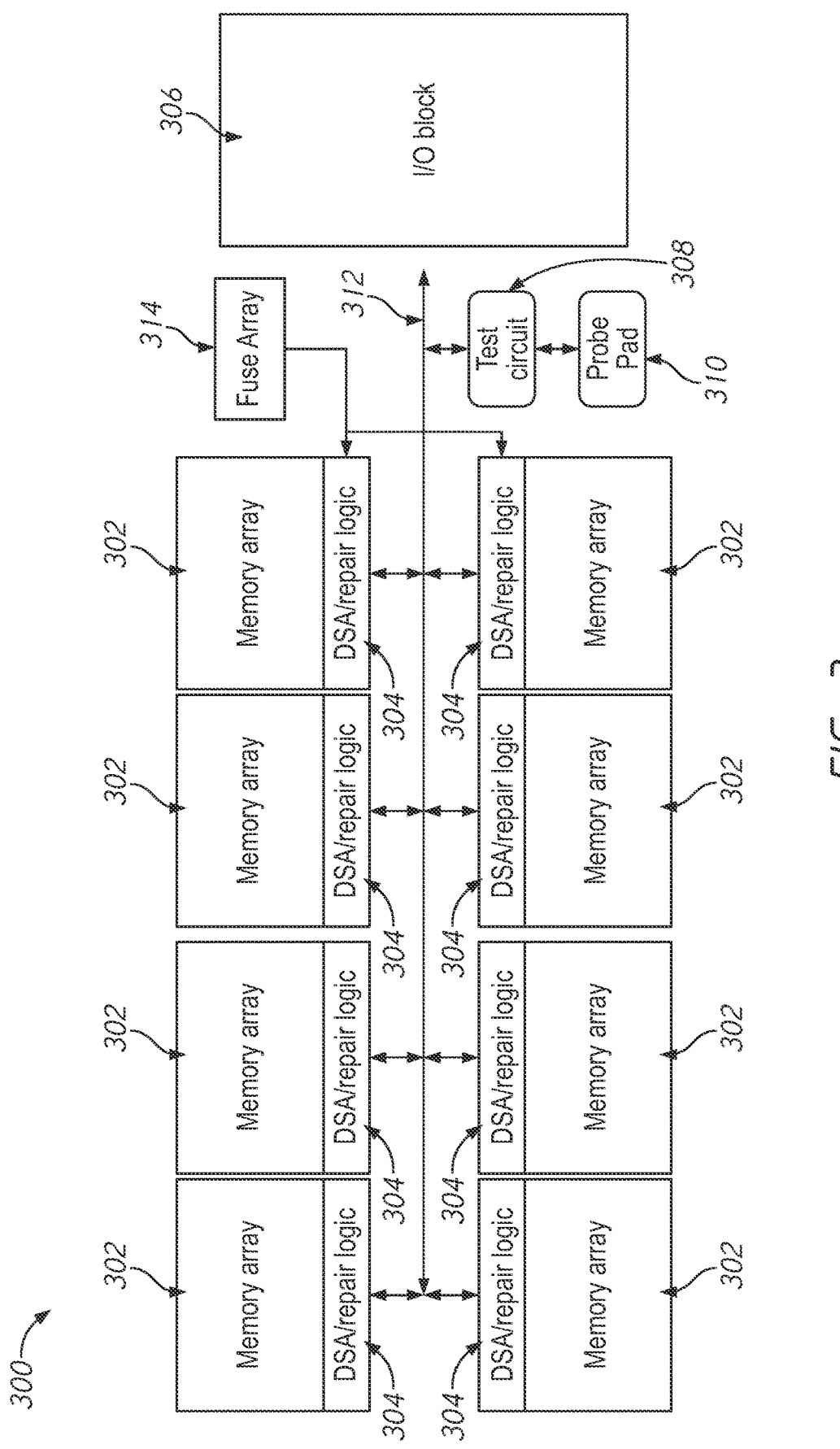
FIG. 3 is a block diagram of a portion of a memory device in accordance with embodiments of the present disclosure.

FIG. 3 is a block diagram of a portion of a memory device in accordance with embodiments of the present disclosure. In some embodiments, the memory device 300 may be included in IF die 103 and/or core die 103. In some embodiments, the memory device 300 may implement one or more of the repair schemes shown in FIG. 2.

The memory device 300 may include multiple memory arrays 302. Each memory array 302 may be associated with data sense amplifiers (DSA) and repair logic circuits 304. During read operations, the DSA may sense data from memory cells of the memory array 302 and provide data to the memory cells during write operations. The repair logic may adjust the mapping of the physical addresses of the memory arrays 302 to logical addresses based on any repairs made to the memory array 302. Although not shown in FIG. 3, the repair logic may be included with and/or communicate with additional circuitry that provides mapping of physical addresses and logical addresses for the memory device 300.

The data may be transmitted to and from the memory arrays 302 via a global data bus 312 coupled to the DSA and repair logic circuits 304. The global data bus 312 may transmit data to and from an input/output (I/O) block 306. The I/O block 306 may include one or more external terminals such as DQ pads. In some embodiments, the DQ pads may be coupled to or implemented by TSVs, such as TSVs 125 shown in FIG. 1. Data may also be transmitted to and from a test circuit 308. The test circuit 308 may be in communication with a probe pad 310. The probe pad 310 (which may also be referred to as a test pad) may be an external terminal accessible to a test probe. In some embodiments, the probe pad 310 may be implemented as a DQ pad, which may optionally be included in the I/O block 306. Although only one test circuit 308 and probe pad 310 are shown in FIG. 3, in other embodiments, the memory device 300 may include multiple test circuits 308 and probe pads 310.

In some embodiments, during testing, the test circuit 308 may analyze data received from the memory arrays 302. Based on the analysis, the test circuit 308 may provide an output to the probe pad 310 that may indicate whether a defect was detected and/or the location of the defect. Based on the output received at the probe pad 310, a user (which may be a human or a computing system testing the memory device 300), may provide commands to repair one or more defects detected in the memory arrays 302. For example, if a defective column plane is detected in a memory array 302, the memory device 300 may receive commands that cause the repair logic to remap the logical address of the column plane from the physical address of the defective column plane to a physical address of a redundant column plane. In some embodiments, the repair information may be stored in a fuse array 314 that is accessible to the repair logic. In some embodiments, the fuse array 314 is included in the repair logic rather than a separate component as shown.

Although not shown in FIG. 3, the data may be processed by additional circuits. For example, memory device 300 may include error correction code (ECC) circuitry and/or Data Buss Inversion (DBI) circuitry, neither shown. During read operations, the ECC and compression circuitry may process the data prior to the data being received by the I/O block 306 and/or test circuit 308. During write operations, the ECC and DBI circuitry may process the data prior to the data being written to the memory arrays 302.

Figure 4:
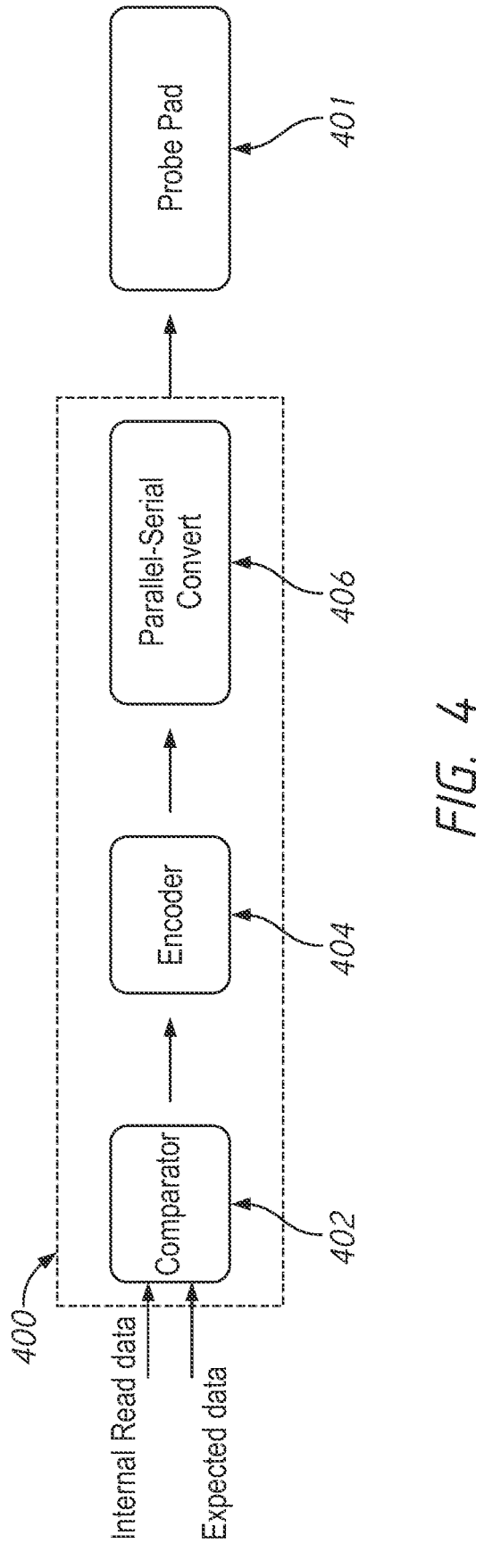
FIG. 4 is a block diagram of an example test circuit according to embodiments of the present disclosure.

FIG. 4 is a block diagram of an example test circuit according to embodiments of the present disclosure. Test circuit 400 may be included in test circuit 308 in some embodiments. A probe pad 401 is also shown for context. In some embodiments, probe pad 401 may be included in probe pad 310. The test circuit 400 may include a comparator 402 that compares internal read data read from one or more memory arrays (e.g., memory arrays 302) with expected data. In some embodiments, the expected data may be provided by a probe coupled to the probe pad 401. In other embodiments, the expected data may be stored elsewhere (e.g., other array, register, fuse array) in a memory device that includes the test circuit 400. If the internal read data does not match the expected data, the comparator may provide error information to an encoder 404. The encoder 404 may encode the error information in a format suitable for a parallel-to-serial data converter (e.g., serializer) circuit 406. The serialized data including the error information may be provided to the probe pad 401. In some embodiments, the probe pad 401 may include multiple probe pads. The error information may be used to determine whether there is a defect in a memory array as well as a location of the defect.

Figure 5:
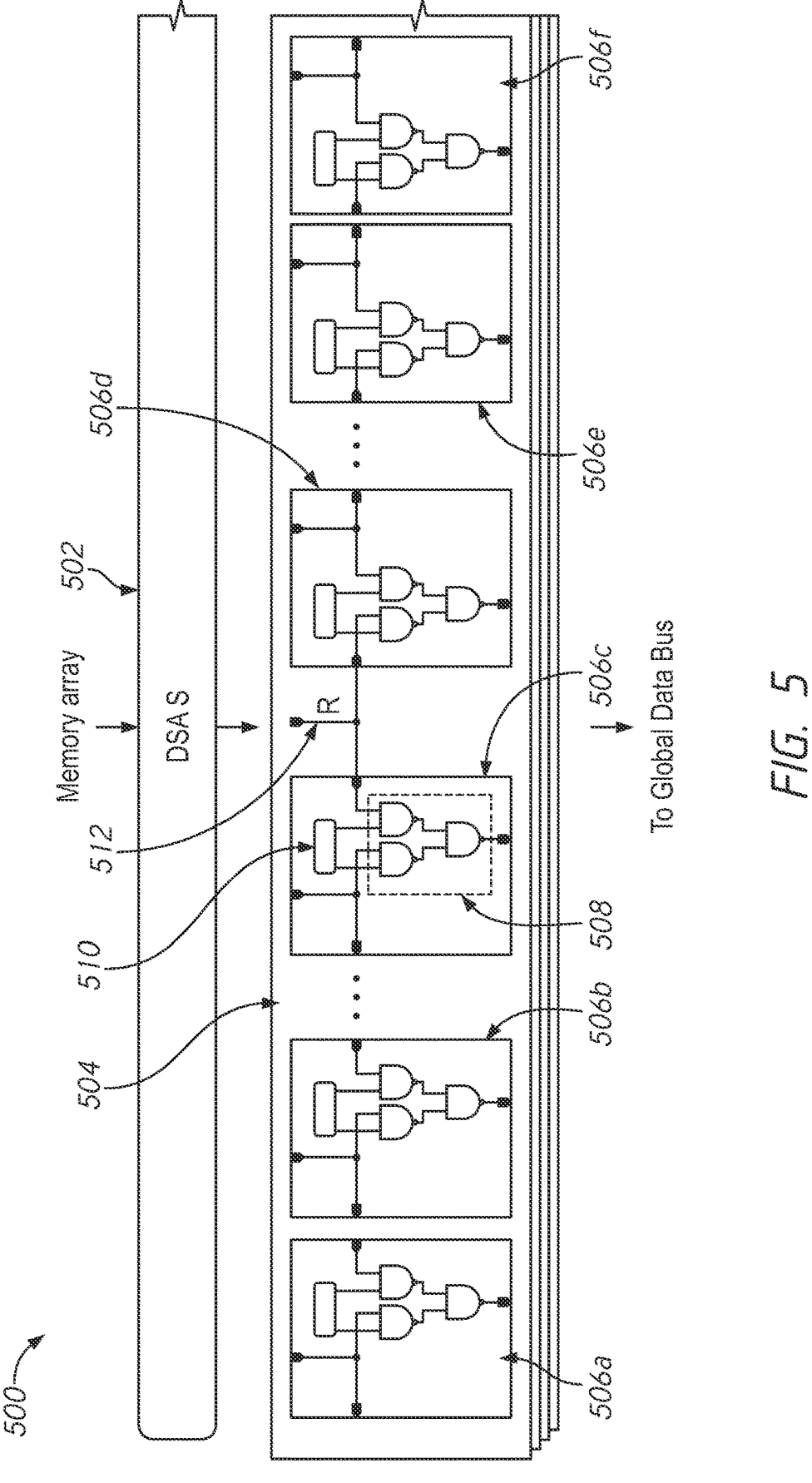
FIG. 5 is a block diagram of a data sense amplifiers and a repair logic circuit block according to embodiments of the present disclosure.

FIG. 5 is a block diagram of a data sense amplifiers and a repair logic circuit block according to embodiments of the present disclosure. In some embodiments, the DSA and repair logic circuit block 500 may be included in the DSA and repair logic circuits 304 shown in FIG. 3. The DSAs 502 may receive data from a memory array, such as memory array 302. The data from the DSAs 502 may be provided to the repair logic circuit block 504.

In the example shown in FIG. 5, the repair logic circuit block 504 implements a shift type repair scheme as described with reference to FIG. 2. The repair logic circuit block 504 may include multiple repair logic circuits 506. Each repair logic circuit 506 may receive data from a first column plane and a second column plane (e.g., an adjacent column plane). The data for both column planes may be provided to a multiplexer 508. A decoder 510 may control whether the multiplexer 508 outputs data from the first column plane or the second column plane. Although not shown in FIG. 5, the decoder 510 may decode repair data received from a fuse array (e.g., fuse array 314). If the repair data indicates no repair affects the column plane, the decoder 510 cause the multiplexer 508 to output data for the first column plane (e.g., see CP7 in no repair 200 and CP5 in shift type 220 in FIG. 2). If the repair data indicates a repair has been made that affects the column plane, the decoder 510 causes the multiplexer 508 to output data for the second column plane (e.g., see CP7 in shift type 220).

Further, certain repair logic circuits 506 may receive data from the redundant column plane as indicated by input 512. In the example shown in FIG. 5, repair logic circuits 506c and 506d receive data from the redundant column plane. If a repair is made on the left-hand side of the array, repair logic circuit 506c will output data from the redundant column plane and repair logic circuit 506d will output data from the "normal" (e.g., non-redundant) column plane it receives data from (e.g., see the channel originally associated with CP17 in shift type 220). If a repair is made on the right-hand side of the array, repair logic circuit 506d will output data from the redundant column plane and repair logic circuit 506c will output data from the "normal" column plane it receives data from. If no repair has occurred, both repair logic circuits 506c and 506d will output data from their respective "normal" column planes. The repair logic circuits 506 may provide the data to the global data bus (e.g., global data bus 312).

While a shift type repair logic circuit is shown in FIG. 5, other repair logic circuits may be used to implement repair logic circuit block 504. For example, for a direct type repair scheme, an address scrambling circuit(s) may be used instead of multiplexers 508. Other examples of repair logic circuits may be found in U.S. Pat. Nos. 9,104,588 and 11,488,685, which are incorporated herein by reference for any purpose.

Figure 6:
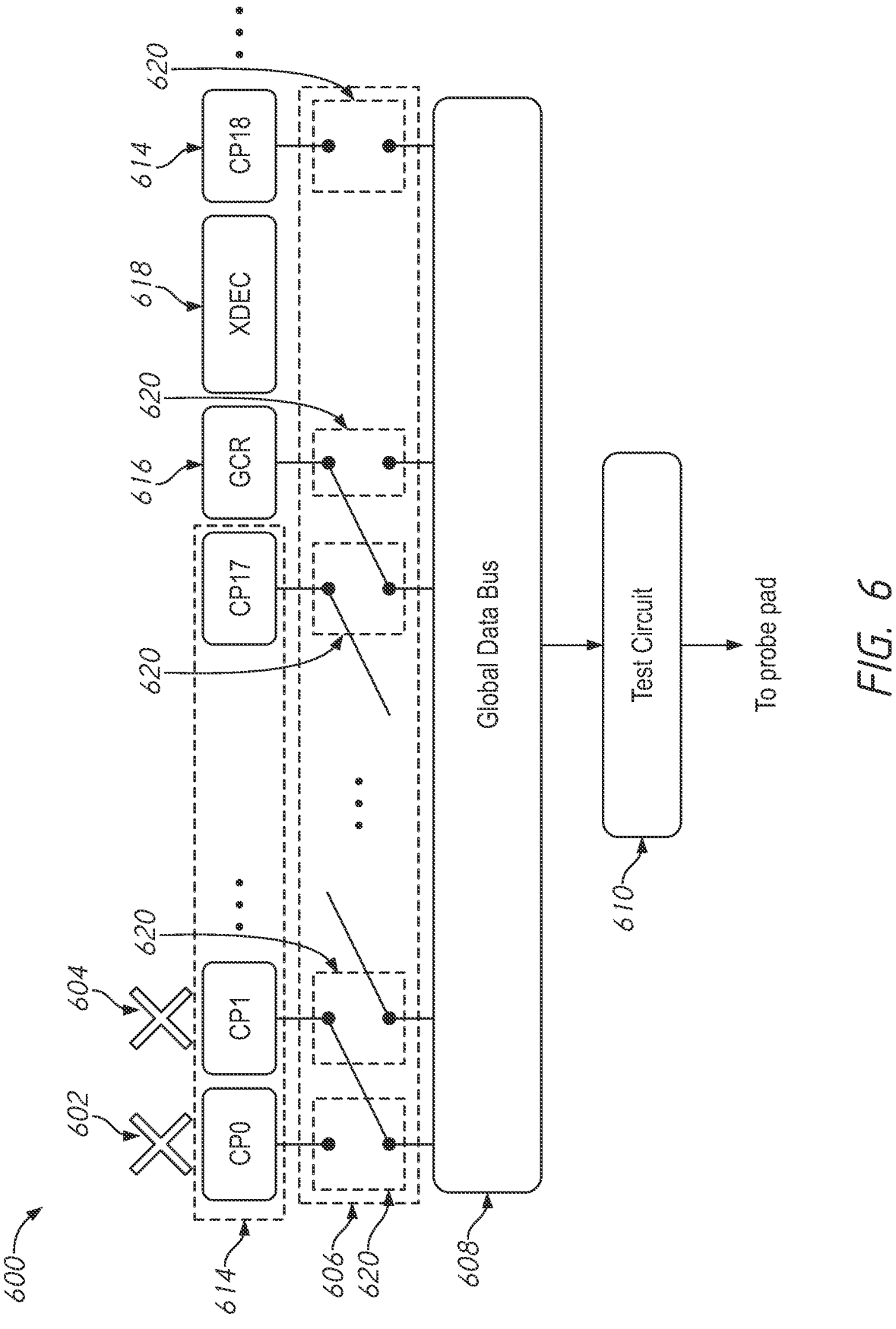
FIG. 6 is a block diagram of a portion of a memory device with two defects according to embodiments of the present disclosure.

FIG. 6 is a block diagram of a portion of a memory device with two defects according to embodiments of the present disclosure. The portion of the memory device 600 may be included in memory device 300 in some embodiments. The memory device 600 may include a memory array with multiple column planes 614, a global column redundancy (GCR) circuit 616, which may include a redundant column plane, and a row decoder 618. The memory device 600 may include repair logic circuit block 606 which may include one or more repair logic circuits 620. The repair logic circuit block 606 may be included in the DSA and repair logic circuits 304 and/or repair logic block 504 in some embodiments. In the example shown in FIG. 6, the repair logic circuits 620 are multiplexers (illustrated as switches) that can implement a shift type repair scheme. The repair logic circuits 620 may be implemented by multiplexers 508 in some embodiments. However, in other embodiments, the repair logic circuits 620 may be address scrambler circuits or other circuits for implementing other types of repair schemes. Data from the column planes 614 pass through the repair logic block 606 to the global data bus 608 to a test circuit 610. In some embodiments, the test circuit 610 may be included in test circuit 308 and/or test circuit 400.

FIG. 6 illustrates that the memory device 600 was tested by providing data from the column planes to the test circuit 610 via a global data bus 608. The test circuit 610 determined that CP0 was defective in the first test as indicated by "X" 602. The repair logic circuit block 606 implemented a repair of CP0 by remapping CP0 to another column plane. The repair may be based, at least in part, on information received from the GCR 616. For example, the GCR 616 may include a fuse array that provides control signals to the repair circuits 620 (e.g., to set a state of a multiplexer). In the example shown, CP0 was repaired using a shift type repair scheme. However, different repair schemes may be used in other embodiments (e.g., direct type repair).

Following the repair of CP0, a new defect occurred, this time at CP1 as indicated by "X" 604. However, if memory device 600 is retested, since the physical address of CP1 has been remapped to a different logical address by the repair logic circuit block 606 to repair CP0, the physical location and logical address of CP1 provided to the test circuit 610 do not match. Accordingly, the test circuit 610 may determine an incorrect physical location of the new defect 604, and an incorrect column plane may be repaired.

Figure 7:
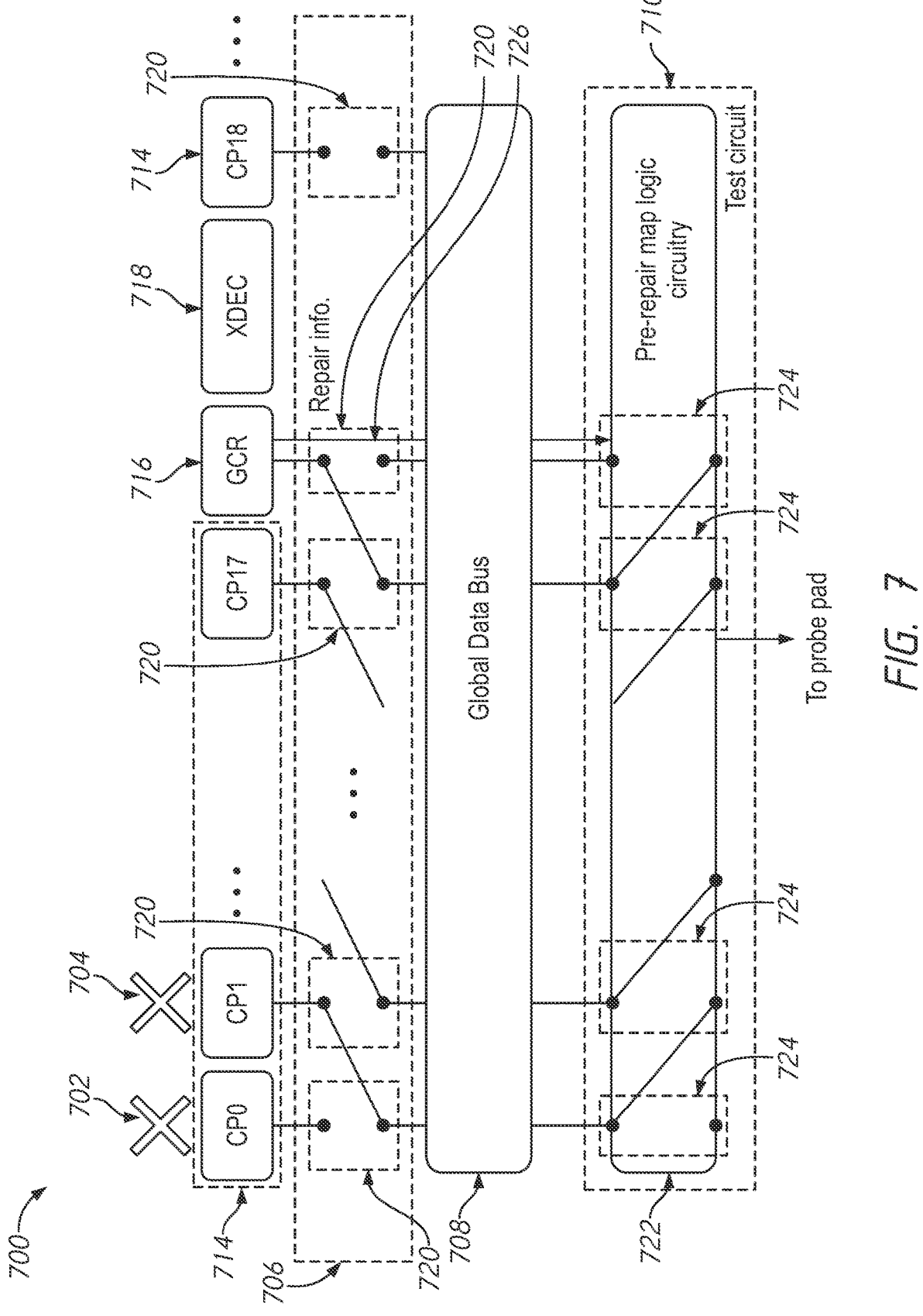
FIG. 7 is block diagram of a portion of a memory device with two defects according to embodiments of the present disclosure.

FIG. 7 is block diagram of a portion of a memory device with two defects according to embodiments of the present disclosure. Portions of memory device 700 may be substantially similar to corresponding portions of memory device 600 of FIG. 6. Accordingly, for brevity, only those portions that differ will be discussed.

According to embodiments of the present disclosure, the test circuit 710 may include pre-repair map logic circuitry 722 (test circuit 710 may include additional components not shown in FIG. 7 in some embodiments). The pre-repair map logic circuitry 722 may include one or mapping logic circuits 724 that remap the physical addresses of the column planes to the logical addresses previously assigned prior to the repair of CP0. In other words, the pre-repair map logic circuitry 722 restores the original pre-repair mapping scheme of the memory device 600. In the example shown in FIG. 7, the mapping logic circuits 724 include multiplexers illustrated as switches. The multiplexers may be similar to those used by the repair circuits 720, but shift back (e.g., re-shift) the mapping of the column planes.

After repair of CP0, the data path 726 of the redundant column plane of the GCR 716 is no longer used. Accordingly, the data path 726 can be repurposed to provide repair info (e.g., from a fuse array, register, or other circuit) to the pre-repair map logic circuitry 722. For example, the repair info provided on the data path 726 may be used to control the state of the multiplexers in mapping circuits 724. Thus, due to the restoration of the pre-repair mapping, the defect information provided by the test circuit 710 to the probe pad will provide the correct physical location of the defect of CP1.

Although the example shown in FIG. 7 shows a shift type repair and re-mapping, the principles of the present disclosure may be used with other repair types. For example, the repair logic circuit block 706 may include address scrambler circuits and the pre-repair map logic circuitry 722 may include address descrambler circuits controlled, at least in part, by the repair info provided on data path 726.

Figure 8:
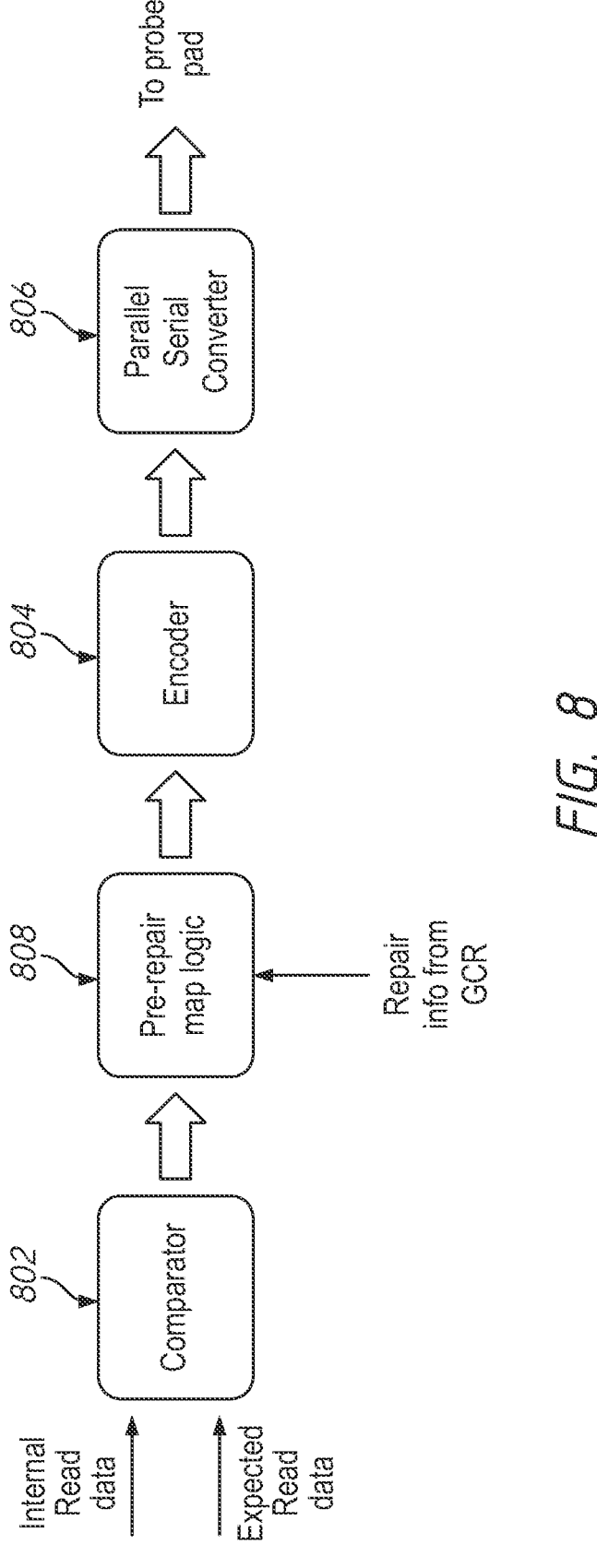
FIG. 8 is a block diagram of an example test circuit according to embodiments of the present disclosure.

FIG. 8 is a block diagram of an example test circuit according to embodiments of the present disclosure. Test circuit 800 may be included in test circuit 308 and/or test circuit 710 in some embodiments. The test circuit 800 may include a comparator 802 that compares internal read data read from one or more memory arrays (e.g., memory arrays 302) with expected data. In some embodiments, the expected data may be provided by a probe coupled to a probe pad. In other embodiments, the expected data may be stored elsewhere (e.g., other array, register, fuse array) in a memory device that includes the test circuit 800. If the internal read data does not match the expected data, the comparator may provide error information.

However, unlike test circuit 400 of FIG. 4, test circuit 800 includes a pre-repair map logic circuit 808, which may receive repair information from a global column redundancy circuit (e.g., GCR 716). If the repair information indicates the portion of the memory being tested has been repaired by remapping logical addresses to new physical locations, the pre-repair map logic circuit 808 may remap the data provided from the comparator 802 to its pre-repair mapping. The error information with the pre-repair mapping may be provided to an encoder 804. The encoder 804 may encode the error information in a format suitable for a parallel-to-serial data converter (e.g., serializer) circuit 806. The serialized data including the error information may be provided to the probe pad.

Optionally, in some embodiments, the pre-repair map logic circuit 808 may be located prior to the comparator 802 and re-map the internal read data and/or expected read data prior to providing it to the comparator 802.

Figure 9:
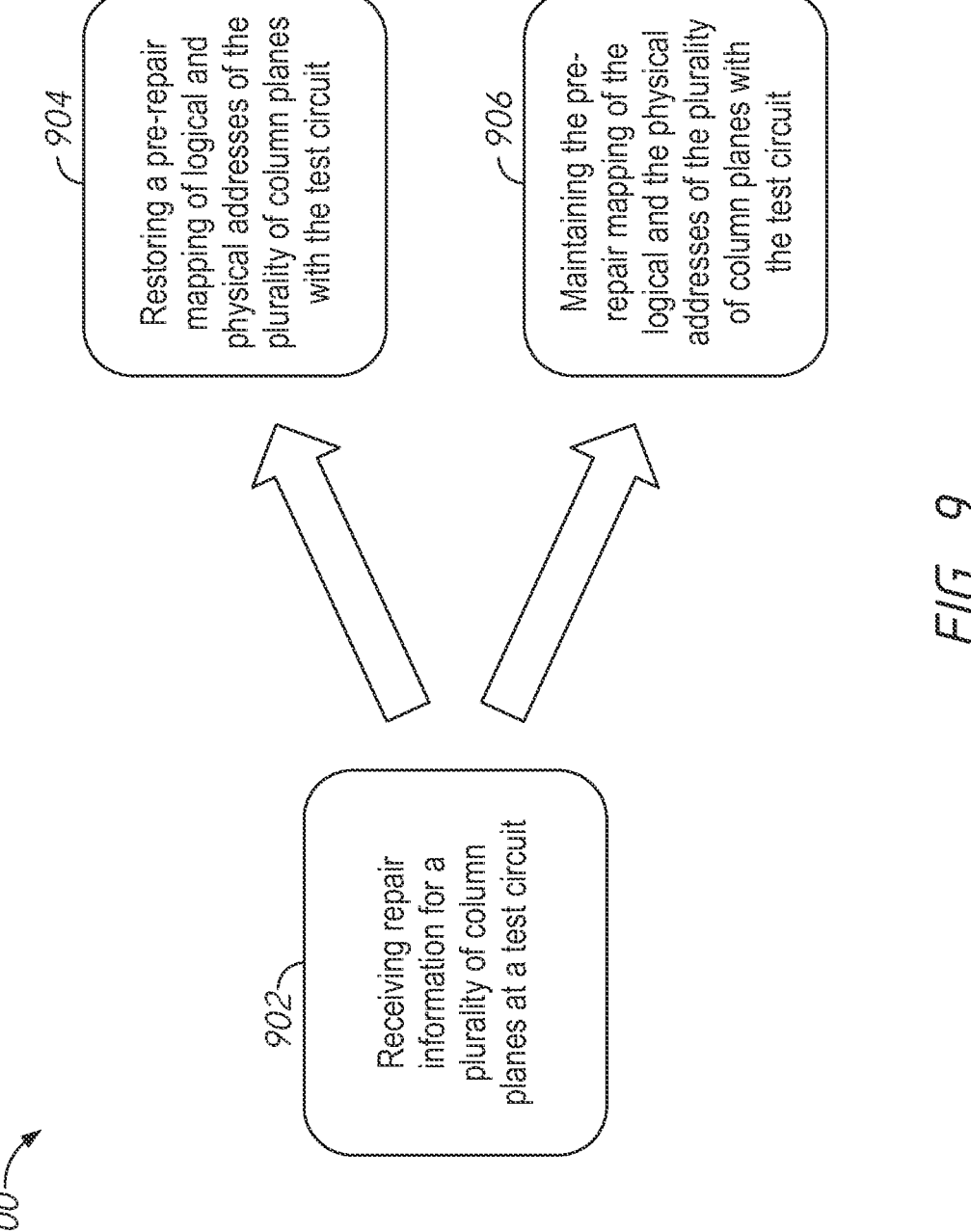
FIG. 9 is a flow chart of a method according to embodiments of the present disclosure.

FIG. 9 is a flow chart of a method according to embodiments of the present disclosure. In some embodiments, the method 900 may be performed in whole or in part by a semiconductor system, such as semiconductor device 100 shown in FIG. 1. In some embodiments, the method may be performed in whole or in part by a memory device, such as memory device 300 and/or 700. In some embodiments, the method may be performed, at least in part, by a test circuit, such as test circuit 710 and/or test circuit 800.

At block 902, "receiving repair information for a plurality of column planes at a test circuit" may be performed. In some embodiments, the repair information is received by the test circuit via a data path coupled to a global column redundancy circuit. In some embodiments, the repair information may be stored in a fuse array of the global column redundancy circuit.

When the repair information indicates at least one of the plurality of column planes has been repaired, block 904 may be implemented where "restoring a pre-repair mapping of logical and physical addresses of the plurality of column planes with the test circuit" is performed. In some embodiments, when the repair information indicates a shift type repair, restoring the pre-repair mapping comprises re-shifting a mapping of the plurality of column planes. In some embodiments, when the repair information indicates a direct type repair, restoring the pre-repair mapping comprises descrambling address of a mapping of the plurality of column planes.

When the repair information indicates no repair has been made, block 906 may be implemented where "maintaining the pre-repair mapping of the logical and the physical addresses of the plurality of column planes with the test circuit" may be performed. In some embodiments, the repair information sets states of a plurality of multiplexers of the test circuit, and the states of the plurality of multiplexers restores the pre-repair mapping or maintains the pre-repair mapping. In some embodiments, the repair information sets states of a plurality of address descrambler circuits of the test circuit, and the states of the plurality of address descrambler circuits restores the pre-repair mapping or maintains the pre-repair mapping.

Optionally, method 900 may further include repairing at least one of the plurality of column planes with a repair logic circuit, wherein the repair logic circuit is configured to perform a shift type repair or a direct type repair.

Optionally, method 900 may further include receiving read data from the plurality of column planes at the test circuit, receiving expected read data at the test circuit, comparing the read data and the expected data, generating error information based on the comparing, encoding the error information, and providing the error information to a probe pad. In some embodiments, the error information provided to the probe pad may be used to determine if defects exist in the memory device including the test circuit.

The self-test circuits of memory devices disclosed herein may include circuitry that adjusts the correspondence between logical and physical addresses to match pre-repair mapping of memory locations. This may allow the test circuit to accurately indicate a physical location of an additional defect that developed between a test and a retest and/or the original defect that was repaired. In some examples, an unused global column redundancy data path may be repurposed to provide repair information to the self-test circuit to implement the pre-repair mapping.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative and should not be construed as limiting the appended claims to any particular embodiment or group of embodiments. Thus, while various embodiments of the disclosure have been described in particular detail, it should also be appreciated that numerous modifications and alternative embodiments may be devised by those having ordinary skill in the art without departing from the broader and intended spirit and scope of the present disclosure as set forth in the claims that follow. Accordingly, the specification and drawings are to be regarded in an illustrative manner and are not intended to limit the scope of the appended claims.

What is claimed is:

1. An apparatus comprising:
   a memory array including a plurality of column planes, wherein the plurality of column planes includes a global column redundancy plane; and
   a test circuit comprising:
      a comparator configured to compare internal read data from the memory array and expected read data, wherein the comparator is configured to provide error information based on comparing; and
      a pre-repair map logic circuit configured to;
         receive repair information and the error information and when the memory array has been repaired by remapping a logical address of a column plane of the plurality of column planes to a physical address of the global column redundancy plane, and
         remap the logical address of the column plane of the plurality of column planes to a physical address of the column plane to restore a pre-repair mapping of the error information in the test circuit.

2. The apparatus of claim 1, wherein the test circuit further comprises an encoder configured to encode the error information provided by the pre-repair map logic circuit and provide encoded error information.

3. The apparatus of claim 2, wherein the test circuit further comprises a parallel serial converter configured to convert the encoded error information from parallel to serial data, wherein the parallel serial converter is further configured to provide serial encoded error information to at least one probe pad.

4. The apparatus of claim 1, wherein the pre-repair map logic circuit comprises a multiplexer, wherein a state of the multiplexer is based, at least in part, on the repair information.

5. The apparatus of claim 1, wherein the pre-repair map logic circuit comprises an address descrambler circuit.

6. The apparatus of claim 1, wherein the repair information is received from a data path of a global column redundancy circuit.

7. An apparatus comprising:
   a memory array comprising a plurality of column planes;
   a global column redundancy circuit including a redundant column plane in the memory array;

a repair circuit configured to remap logical addresses of the plurality of column planes from original physical addresses to new physical addresses of the plurality of column planes and the redundant column plane when at least one of the plurality of column planes is a defective column plane; and
   a test circuit including a pre-repair mapping circuit configured to receive data from at least a portion of the plurality of column planes and repair information from the global column redundancy circuit, wherein when the repair information indicates a repair has been performed on the defective column plane, the test circuit is configured to remap the logical addresses of the plurality of column planes to the original physical addresses of the plurality of column planes to restore a pre-repair mapping of the plurality of column planes within the test circuit.

8. The apparatus of claim 7, further comprising a data path coupled between the global column redundancy circuit and the test circuit, wherein the global column redundancy circuit is configured to provide the repair information to the test circuit via the data path.

9. The apparatus of claim 7, wherein the repair circuit comprises a first plurality of multiplexers and the test circuit comprises a second plurality of multiplexers.

10. The apparatus of claim 7, wherein the test circuit is configured to generate error information based, at least in part, on the pre-repair mapping and the data from at least the portion of the plurality of columns planes, and wherein the apparatus further comprises an external terminal configured to receive the error information.

11. The apparatus of claim 10, wherein the external terminal comprises a DQ pad.

12. The apparatus of claim 10, wherein the external terminal comprises a probe pad.

13. A method comprising:
   receiving repair information for a plurality of column planes of a memory array at a test circuit;
   when the repair information indicates at least one of the plurality of column planes has been repaired using a redundant column plane of the memory array, restoring a pre-repair mapping of logical and physical addresses of the plurality of column planes by remapping the logical addresses to original ones of the plurality of column planes within the test circuit; and
   when the repair information indicates no repair has been made, maintaining the pre-repair mapping of the logical and the physical addresses of the plurality of column planes within the test circuit.

14. The method of claim 13, wherein the repair information indicates a shift type repair, and restoring the pre-repair mapping comprises re-shifting a mapping of the plurality of column planes.

15. The method of claim 13, wherein the repair information indicates a direct type repair, and restoring the pre-repair mapping comprises descrambling an address of a mapping of the plurality of column planes.

16. The method of claim 13, wherein the repair information sets states of a plurality of multiplexers of the test circuit, and the states of the plurality of multiplexers restores the pre-repair mapping or maintains the pre-repair mapping.

17. The method of claim 13, wherein the repair information sets states of a plurality of address descrambler circuits of the test circuit, and the states of the plurality of address descrambler circuits restores the pre-repair mapping or maintains the pre-repair mapping.

18. The method of claim 13, further comprising repairing at least one of the plurality of column planes with a repair logic circuit of the test circuit, wherein the repair logic circuit is configured to perform a shift type repair or a direct type repair.

19. The method of claim 13, wherein the repair information is received by the test circuit via a data path coupled to a global column redundancy circuit.

20. The method of claim 13, further comprising:

receiving read data from the plurality of column planes at the test circuit;

receiving expected read data at the test circuit;

comparing the read data and the expected data;

generating error information based on the comparing;

encoding the error information; and providing the error information to a probe pad.

* * * * *